(12) United States Patent
Uchida et al.

(10) Patent No.: US 10,756,060 B2
(45) Date of Patent: Aug. 25, 2020

(54) SEMICONDUCTOR DEVICE

(71) Applicant: TOSHIBA MEMORY CORPORATION, Minato-ku (JP)

(72) Inventors: Yuki Uchida, Yokkaichi (JP); Takeshi Watanabe, Yokkaichi (JP); Ken Hayakawa, Yokkaichi (JP); Ayana Amano, Nagoya (JP); Yuki Sugo, Suzuka (JP); Reishuku Ikebe, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 17 days.

(21) Appl. No.: 16/247,616

(22) Filed: Jan. 15, 2019

(65) Prior Publication Data

US 2020/0020669 A1  Jan. 16, 2020

(30) Foreign Application Priority Data

Jul. 12, 2018 (JP) .................. 2018-132154

(51) Int. Cl.

| | |
|---|---|
| *H01L 25/065* | (2006.01) |
| *H01L 23/28* | (2006.01) |
| *H01L 23/538* | (2006.01) |
| *H01L 27/11568* | (2017.01) |
| *H01L 23/498* | (2006.01) |

(Continued)

(52) U.S. Cl.
CPC .......... *H01L 25/0657* (2013.01); *H01L 23/28* (2013.01); *H01L 23/3135* (2013.01); *H01L 23/49811* (2013.01); *H01L 23/5385* (2013.01); *H01L 27/11551* (2013.01); *H01L 27/11568* (2013.01); *H01L 2224/48247* (2013.01)

(58) Field of Classification Search
CPC .. H01L 23/3135; H01L 23/28; H01L 23/3128
See application file for complete search history.

(56) References Cited

U.S. PATENT DOCUMENTS

| | | | |
|---|---|---|---|
| 7,615,413 B2 | 11/2009 | Yoshimura et al. | |
| 8,143,716 B2 | 3/2012 | Kawano et al. | |
| (Continued) | | | |

FOREIGN PATENT DOCUMENTS

| | | |
|---|---|---|
| JP | 2005-285997 | 10/2005 |
| JP | 2013-131557 | 7/2013 |
| (Continued) | | |

*Primary Examiner* — Selim U Ahmed
*Assistant Examiner* — Evan G Clinton
(74) *Attorney, Agent, or Firm* — Oblon, McClelland, Maier & Neustadt, L.L.P.

(57) ABSTRACT

A semiconductor device according to an embodiment comprises a substrate and a first semiconductor chip provided above the substrate. A second semiconductor chip is provided above the first semiconductor chip. A spacer chip is provided between the first semiconductor chip and the second semiconductor chip with regard to a direction orthogonal to a mount surface of the substrate, the spacer chip being made of a first resin material. A first adhesive material is provided between the spacer chip and the substrate or the first semiconductor chip. A second adhesive material is provided between the spacer chip and the second semiconductor chip. A second resin material covers the first and second semiconductor chips and the spacer chip.

20 Claims, 5 Drawing Sheets

(51) Int. Cl.
*H01L 27/11551* (2017.01)
*H01L 23/31* (2006.01)

(56) References Cited

U.S. PATENT DOCUMENTS

| | | |
|---|---|---|
| 8,896,111 B2 | 11/2014 | Tanimoto et al. |
| 8,896,130 B2 | 11/2014 | Liu et al. |
| 2009/0001599 A1 | 1/2009 | Foong et al. |
| 2010/0027233 A1* | 2/2010 | Low .................. H01L 21/565 |
| | | 361/810 |
| 2011/0210455 A1* | 9/2011 | Oonishi ................ H01L 24/27 |
| | | 257/798 |
| 2013/0099393 A1* | 4/2013 | Jeong ................ H01L 25/0657 |
| | | 257/777 |
| 2013/0114323 A1 | 5/2013 | Shindo et al. |
| 2014/0070428 A1* | 3/2014 | Tanimoto .............. H01L 23/488 |
| | | 257/777 |
| 2015/0115438 A1 | 4/2015 | Lee et al. |
| 2016/0148918 A1* | 5/2016 | Ye ........................ H01L 24/04 |
| | | 711/154 |
| 2017/0358559 A1 | 12/2017 | Ye et al. |

FOREIGN PATENT DOCUMENTS

| | | |
|---|---|---|
| JP | 2014-167973 | 9/2014 |
| JP | 2014-187221 A | 10/2014 |
| TW | 200727446 A | 7/2007 |
| TW | 201411806 A | 3/2014 |
| TW | 201438165 A | 10/2014 |
| TW | 201803063 A | 1/2018 |

\* cited by examiner

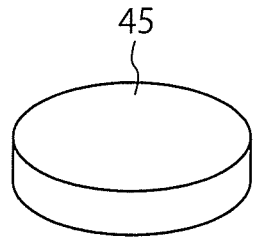
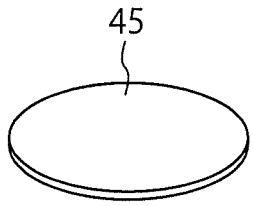
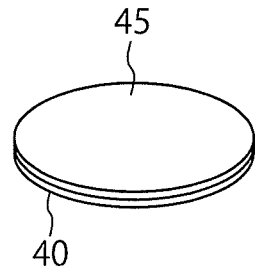
FIG. 3A        FIG. 3B        FIG. 3C
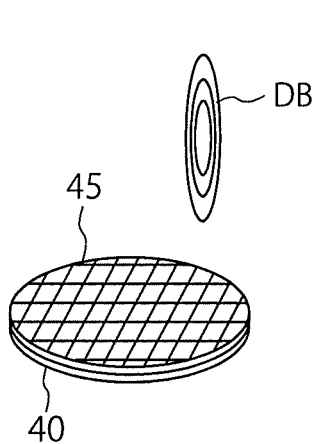
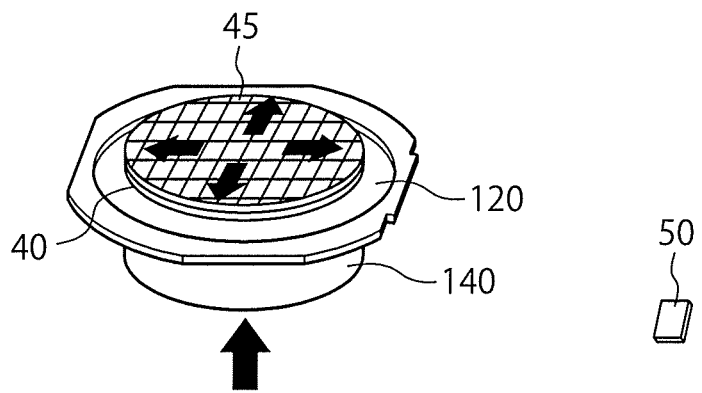
FIG. 3D        FIG. 3E        FIG. 3F
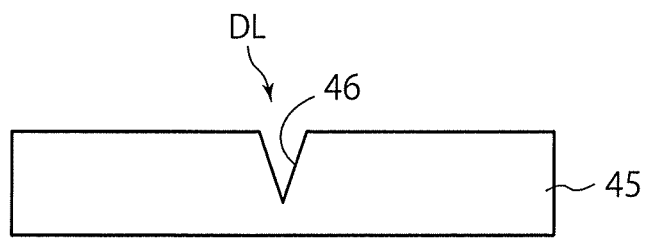
FIG. 4

US 10,756,060 B2

SEMICONDUCTOR DEVICE

CROSS REFERENCE TO RELATED APPLICATIONS

This application is based upon and claims the benefit of priority from the prior Japanese Patent Application No. 2018-132154, filed on Jul. 12, 2018, the entire contents of which are incorporated herein by reference.

FIELD

The embodiments of the present invention relate to a semiconductor device.

BACKGROUND

In some packages of a semiconductor device such as a NAND flash memory, a plurality of semiconductor chips such as a memory chip and a controller chip are stacked by using an FOD (Film On Device) technology. In the FOD technology, a spacer chip is sometimes used to enable a lower-layer semiconductor chip (a lower-layer chip) to be embedded in an adhesive film even if an upper-layer chip is downscaled.

However, a mirror chip made of the same material as that of a semiconductor substrate and having no patterns is used as the spacer chip and the surface thereof is in a mirror state. Accordingly, the spacer chip is low in adhesion to a mold resin that seals semiconductor chips and there is a risk that detachment occurs at an interface between the spacer chip and the mold resin under a hot and humid environment. This tendency reduces the reliability of the semiconductor device.

Further, it is conceivable that the spacer chip is coated with polyimide to enhance the adhesion to the mold resin. However, use of polyimide increases the manufacturing cost.

BRIEF DESCRIPTION OF THE DRAWINGS

FIGS. 3A to 3F are diagrams illustrating an example of a manufacturing method of a spacer chip according to the first embodiment;

FIG. 4 is a sectional view illustrating a portion corresponding to the dicing line of the resin material;

DETAILED DESCRIPTION

Figure 1:
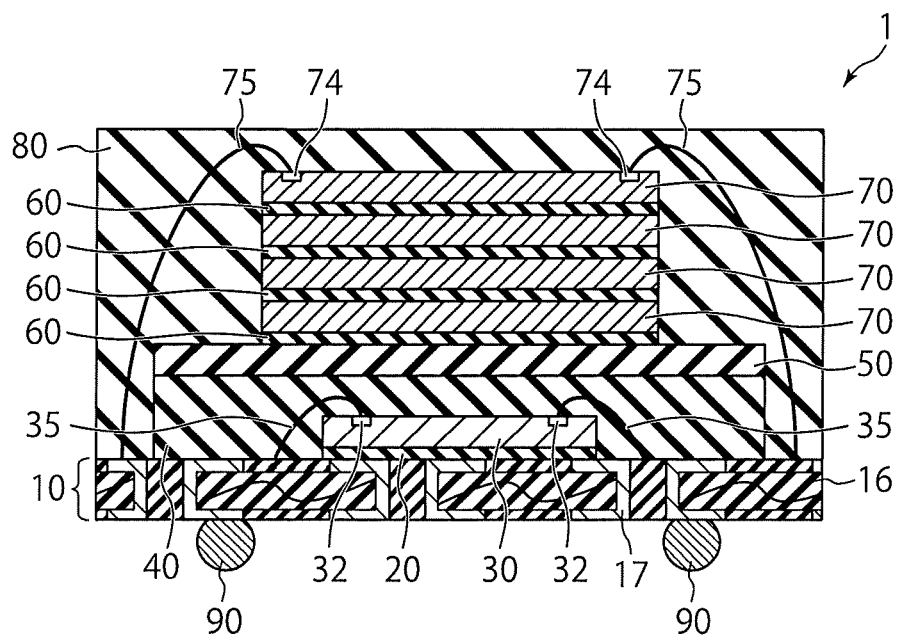
FIG. 1 is a sectional view illustrating an example of the configuration of a semiconductor device according to a first embodiment.

Embodiments will now be explained with reference to the accompanying drawings. The present invention is not limited to the embodiments. In the embodiments, "an upper direction" or "a lower direction" refers to a relative direction when a direction perpendicular to a surface of a substrate on which semiconductor chips are mounted is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment comprises a substrate and a first semiconductor chip located above the substrate. A second semiconductor chip is located above the first semiconductor chip. A spacer chip is located between the first semiconductor chip and the second semiconductor chip with regard to a direction orthogonal to a mount surface of the substrate, the spacer chip being made of a first resin material. A first adhesive material is located between the spacer chip and the substrate or the first semiconductor chip. A second adhesive material is located between the spacer chip and the second semiconductor chip. A second resin material covers the first and second semiconductor chips and the spacer chip.

First Embodiment

FIG. 1 is a sectional view illustrating an example of the configuration of a semiconductor device 1 according to a first embodiment. The semiconductor device 1 according to the present embodiment is a surface-mount semiconductor package and can be, for example, a BGA (Ball Grid Array package), a MAP (Mold Array Package), or an LGA (Land Grid Array package). The semiconductor device 1 can also be a semiconductor memory device such as a NAND flash memory. The semiconductor device 1 includes a substrate 10, an adhesive material 20, a controller chip 30, an adhesive material 40, a spacer chip 50, an adhesive material 60, memory chips 70, a mold resin 80, and metal bumps 90.

The substrate 10 is, for example, a multi-layer wiring substrate including a singular or plural insulating layers (third resin materials) 16 and a singular or plural wiring layers 17 stacked to be integrated together. A resin material such as a glass epoxy resin or a glass-BT resin (Bismaleimide-Triazine resin) is used as the insulating layers 16. The wiring layers 17 are provided in the substrate 10 or on the front and back surfaces of the substrate 10 and are electrically connected to a bonding pad (not illustrated). A low-resistance conductive material such as copper is used as the wiring layers 17. The planar shape of the substrate 10 is not particularly limited and can be substantially rectangular or substantially square.

A solder resist mask (not illustrated) is provided on the back surface of the substrate 10. The solder resist mask is not provided on regions where the metal bumps 90 are formed and the metal bumps 90 are electrically connected to the wiring layers 17 that are exposed from the solder resist mask. This configuration enables the metal bumps 90 to function as an external connection terminal and be connected to other semiconductor devices. For example, a conductive material such as solder is used as the metal bumps 90.

The controller chip 30 being a first semiconductor chip is stuck and fixed onto the front surface of the substrate 10 with the adhesive material (DAF (Die Attachment Film)) 20. The controller chip 30 is a semiconductor chip that controls the memory chips 70 and semiconductor elements (such as transistors) constituting a control circuit are provided on the front surface of the controller chip 30. The controller chip 30 has bonding pads 32 connected to an internal control circuit and is electrically connected to the bonding pad (not illustrated) of the substrate 10 with metallic wires 35. The controller chip 30 selects a memory chip 70 to which write or read of data is performed, or performs write or read of data into or from the selected memory chip 70. A plurality of the controller chips 30 can be placed on the substrate 10.

The adhesive material 20 is provided between the substrate 10 and the controller chip 30 and causes the controller chip 30 to adhere to the substrate 10. For example, an adhesive film (DAF) made of a thermosetting resin is used as the adhesive material 20.

The spacer chip 50 is provided on the adhesive material 40 and is arranged above the substrate 10 and the controller chip 30 in such a manner that contact with the substrate 10 and the controller chip 30 is prevented by the adhesive material 40. Any internal wiring that provides electrical connection to the controller chip 30 or the memory chips 70 is not provided in the spacer chip 50. A thermosetting resin material (first resin material) is used as the spacer chip 50. When cooled and cured after being heated and reflowed, a thermosetting resin has stable dimension and shape. Accordingly, with use of a thermosetting resin as the spacer chip 50, the spacer chip 50 becomes easy to process when heated and can stably support the memory chips 70 when cooled.

In the present embodiment, the resin material (first resin material) of the spacer chip 50 is the same material as the mold resin 80 being a second resin material. Because the spacer chip 50 is made of the same material as the mold resin 80, the adhesiveness between the spacer chip 50 and the mold resin 80 is enhanced and detachment occurring between the spacer chip 50 and the mold resin 80 can be suppressed. For example, the resin material of the spacer chip 50 is an epoxy resin composition having an epoxy resin as a primary component and containing a phenol resin and a silica filler.

The adhesive material 40 being a first adhesive material is provided between the controller chip 30 and the spacer chip 50 and between the substrate 10 and the spacer chip 50, and causes the spacer chip 50 to be stuck and fixed onto the substrate 10 and the controller chip 30. The adhesive material 40 also covers the controller chip 30, the metallic wires 35, and the like to protect these members. For example, an adhesive film (DAF) made of a thermosetting resin is used as the adhesive material 40. A composition of an epoxy resin, a phenol resin, an acrylic resin, and a silica filler is used as the adhesive material 40, for example. The thickness of the adhesive material 40 is a value from 5 micrometers to 150 micrometers. The adhesive material 40 is a material melting at a lower temperature than the spacer chip 50. Therefore, the adhesive material 40 can be reflowed to embed the controller chip 30, the metallic wires 35, and the like with the adhesive material 40 without melting the spacer chip 50.

The adhesive material 60 being a second adhesive material is provided between the spacer chip 50 and the memory chips 70 and causes the memory chips 70 to adhere to the spacer chip 50. For example, an adhesive film (DAF) made of a thermosetting resin is used as the adhesive material 60.

The memory chips 70 being second semiconductor chips are provided on the adhesive material 60 and are fixed onto the spacer chip 50 with the adhesive material 60. The memory chips 70 are, for example, semiconductor chips each having a NAND flash memory and a two-dimensional or three-dimensional memory cell array is provided on the front surface of a semiconductor substrate. The memory chips 70 have bonding pads 74 connected to an internal circuit and the bonding pads 74 are electrically connected to a bonding pad (not illustrated) of the substrate 10 with metallic wires 75. With this configuration, the memory chips 70 are electrically connected to the controller chip 30 via the metallic wires 75 and 35 and internal wiring of the substrate 10, and can operate under control of the controller chip 30. Although not illustrated, the metallic wires 75 can connect lower-layer memory chips 70 as well as the topmost-layer memory chip 70 to the substrate 10. Alternatively, the lower-layer memory chips 70 can be electrically connected to each other via a through-via. In this case, there is no need to perform wire bonding of the lower-layer memory chips 70 with the metallic wires 75.

In the present embodiment, the memory chips 70 are stacked on the spacer chip 50. In this case, each of the memory chips 70 is stuck to the spacer chip 50 or the memory chip 70 located right under the memory chip 70 with the adhesive material 60.

The mold resin 80 is provided on the substrate 10 and covers the controller chip 30, the spacer chip 50, the memory chips 70, and the metallic wires 35 and 75. The mold resin 80 protects the controller chip 30, the spacer chip 50, the memory chips 70, and the metallic wires 35 and 75 against the outside of the semiconductor device 1.

Figure 2:
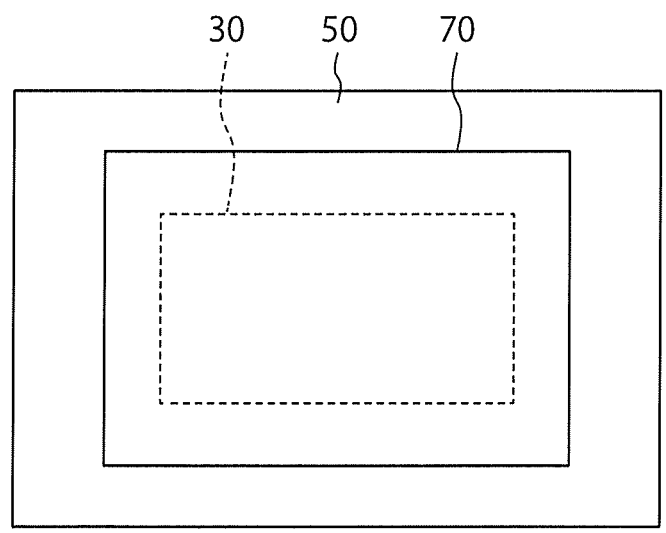
FIG. 2 is a plan view illustrating an example of the outer shapes of the controller chip, the spacer chip, and the memory chips.

FIG. 2 is a plan view illustrating an example of the outer shapes of the controller chip 30, the spacer chip 50, and the memory chips 70. As illustrated in FIG. 2, when viewed from above the mount face of the substrate 10, the outer edge of the spacer chip 50 is located on an outer side than the outer edges of the controller chip 30 and the memory chips 70. That is, the spacer chip 50 is provided between the controller chip 30 and the memory chips 70 with regard to a direction orthogonal to the mount face of the substrate 10, and is larger than the controller chip 30 and the memory chips 70 in the mount area of the substrate 10. The outer shape of the spacer chip 50 can be substantially similar to that of the controller chip 30 or the memory chips 70.

When the memory chips 70 has a size equivalent to that of the spacer chip 50, it suffices to provide the adhesive material 40 between the back surface of the memory chips 70 and the controller chip 30 or the substrate 10 and embed the controller chip 30 and the metallic wires 35 with the adhesive material 40 without providing the spacer chip 50. However, if the size of the memory chips 70 becomes close to that of the controller chip 30 due to downscaling of the memory chips 70, the size of the adhesive material 40 stuck onto the back surface of the memory chips 70 also decreases. Therefore, the controller chip 30 and the metallic wires 35 cannot be sufficiently covered by the adhesive material 40.

In contrast thereto, the size of the spacer chip 50 according to the present embodiment is larger than those of the controller chip 30 and the memory chips 70 and the outer edge of the spacer chip 50 is located on an outer side than the outer edges of the controller chip 30 and the memory chips 70. Accordingly, the size of the adhesive material (DAF) 40 stuck onto the spacer chip 50 can be maintained to sufficiently cover the entire part of the controller chip 30 and the metallic wires 35 with the adhesive material 40.

If a mirror-like semiconductor substrate (a silicon substrate, for example) constituting the controller chip 30 or the memory chips 70 is used as a spacer chip, the spacer chip is relatively low in the adhesiveness to the mold resin 80 and easily detaches from the mold resin 80.

In contrast thereto, the spacer chip 50 is made of the same resin material as the mold resin 80. Therefore, the adhesiveness between the spacer chip 50 and the mold resin 80 is relatively high and detachment is unlikely to occur. As a result, the reliability of the semiconductor device 1 can be enhanced.

It is unnecessary to apply an expensive macromolecular organic material such as polyimide onto the spacer chip 50 according to the present embodiment. Therefore, according to the present embodiment, increase of the manufacturing cost can be suppressed.

A manufacturing method of the spacer chip 50 according to the present embodiment is explained next.

FIGS. 3A to 3F are diagrams illustrating an example of a manufacturing method of a spacer chip according to the first embodiment.

First, as illustrated in FIG. 3A, a columnar resin material 45 having any thickness is formed. The resin material 45 can be molded using a mold or the like, or can be formed by application onto a circular member such as a semiconductor wafer. The diameter of the resin material 45 preferably has a size equivalent to that of a semiconductor wafer. This configuration enables the resin material 45 to be singulated by an identical process to the dicing process for a semiconductor wafer. It is preferable that the resin material 45 is the same thermosetting resin as the mold resin 80. Accordingly, the resin material 45 can be heated to be molded in a molding process for the resin material 45.

Next, the columnar resin material 45 illustrated in FIG. 3A is polished using a polishing device to cause the resin material 45 to have a desired thickness as illustrated in FIG. 3B.

Subsequently, the adhesive material (DAF) 40 is applied to the back surface of the resin material 45 as illustrated in FIG. 3C.

Next, a dicing tape (not illustrated in FIG. 3D) is applied to the adhesive material 40 and the resin material 45 is cut into the size of the spacer chip 50 with a dicing blade DB as illustrated in FIG. 3D. At this time, it suffices that the dicing blade DB cuts the resin material 45 and the adhesive material 40 in the middle of the thickness.

Subsequently, the dicing tape 120 is pushed upward from below by a pushing member 140 to stretch (expand) the dicing tape 120 as illustrated in FIG. 3E. Accordingly, the resin material 45 is pulled outward along with the dicing tape 120. At this time, the resin material 45 and the adhesive material 40 are cleaved along dicing lines to be singulated into a plurality of the spacer chips 50.

The resin material 45 and the adhesive material 40 can be singulated by any dicing method such as a blade dicing method, an expanding method, a laser dicing method, or a jig cutting method.

Subsequently, the spacer chip 50 as illustrated in FIG. 3F is picked up by a die bonding device (not illustrated) and is mounted on the substrate 10 having the controller chip 30 mounted thereon. In this case, the spacer chip 50 is placed on the controller chip 30 and the metallic wires 35 along with the adhesive material 40 (not illustrated in FIG. 3F) and is heated and pressurized. At this time, the spacer chip 50 is heated at such a temperature that the spacer chip 50 is not reflowed and the adhesive material 40 is reflowed. Accordingly, the adhesive material 40 is reflowed to embed the controller chip 30 and the metallic wires 35 and be stuck to the substrate 10 as illustrated in FIG. 1.

Thereafter, the memory chips 70 each having the adhesive material 60 are stacked on the spacer chip 50, and the memory chips 70 and the substrate 10 are bonded with the metallic wires 75. Further, the controller chip 30, the spacer chip 50, the memory chips 70, the metallic wires 75, and the like are sealed with the mold resin 80 and the metal bumps 90 are formed on the back side of the substrate 10. A package structure illustrated in FIG. 1 is obtained in this manner.

In this way, the spacer chip 50 according to the present embodiment can be formed by an identical process to the dicing process for a semiconductor wafer.

Furthermore, the spacer chip 50 is formed of the same resin material as the mold rein 80. Therefore, the adhesiveness between the spacer chip 50 and the mold rein 80 is relatively high and detachment is unlikely to occur.

Because the spacer chip 50 is formed of the resin material, there is no need to apply any expensive macromolecular organic material such as polyimide. Accordingly, increase of the manufacturing cost can be suppressed.

First Modification

In a case where the resin material 45 is formed to have a thickness after the polishing illustrated in FIG. 3B at the time of forming the resin material 45 illustrated in FIG. 3A, the formation process for the resin material 45 illustrated in FIG. 3A can be omitted. In this case, it suffices that the resin material 45 is formed by applying a resin material onto a circular member as a semiconductor wafer. Alternatively, the resin material 45 according to a first modification can be molded using a mold or the like, similarly to the resin material 45 illustrated in FIG. 3A.

Thereafter, the processes explained with reference to FIGS. 3C to 3E are performed, whereby the spacer chip 50 illustrated in FIG. 3F is formed. Also in this way, the spacer chip 50 identical to that in the first embodiment can be formed.

Second Modification

The resin material 45 can be also formed directly on the adhesive material 40 at the time of forming the resin material 45. For example, the resin material 45 is applied to have a desired thickness on a sheet-like adhesive material 40. Next, the adhesive material 40 and the resin material 45 are cut to have a size equivalent to that of a semiconductor wafer. A stack body including the adhesive material 40 and the resin material 45 illustrated in FIG. 3C is formed in this manner.

Thereafter, the processes explained with reference to FIGS. 3D and 3E are performed, whereby the spacer chip 50 illustrated in FIG. 3F is formed. Also in this way, the spacer chip 50 identical to that in the first embodiment can be formed.

Third Modification

In the first embodiment, after the adhesive material 40 is stuck to the resin material 45 as illustrated in FIG. 3C, dicing and expansion are performed as illustrated in FIGS. 3D and 3E.

In contrast thereto, in a third modification, a slit 46 is provided in advance on the dicing line DL of the resin material 45 as illustrated in FIG. 4. FIG. 4 is a sectional view illustrating a portion corresponding to the dicing line DC of the resin material 45. The slit 46 is formed to reach an intermediate position in the thickness of the resin material 45. The adhesive material 40 is stuck to the back surface of the resin material 45 having the slit 46. A dicing tape is further stuck to the resin material 45 and the adhesive material 40, and the resin material 45 and the adhesive material 40 are expanded on the dicing tape. Accordingly, the resin material 45 and the adhesive material 40 are cleaved along the slit 46 to be singulated into the spacer chips 50. The slit 46 can be provided at the same time as the resin material 45 is molded with a mold. This process enables the resin material 45 to be singulated by the expanding method, without dicing the resin material 45 with a dicing blade. Also in the third modification, the spacer chip 50 identical to that in the first embodiment can be formed.

Fourth Modification

In the first embodiment, the resin material (first resin material) of the spacer chip 50 is the same resin material as the mold resin 80. However, the spacer chip 50 can be a resin material similar to the mold resin 80 or a resin material same as or similar to the insulating layers 16 of the substrate 10. For example, the resin material of the spacer chip 50 can be a material having an epoxy resin as a primary component and containing a phenol resin, an acrylic resin, a silica filler, a titanium oxide filler, and a glass cloth. For example, when a glass cloth is contained in an epoxy material, the resin material of the spacer chip 50 becomes a glass epoxy resin. In this way, even if the spacer chip 50 is a resin material similar to the mold resin 80 or a resin material same as or similar to the insulating layers 16 of the semiconductor 10, the adhesiveness of the spacer chip 50 to the mold resin 80 is improved and the reliability of the semiconductor device can be enhanced. When the spacer chip 50 is a glass epoxy substrate, a copper foil or a solder resist mask can be provided on the front surface and/or the back surface of the glass epoxy substrate. An identification mark of the semiconductor device can be presented (stamped) by etching on the front surface and/or the back surface of the glass epoxy substrate.

Furthermore, the spacer chip 50 can have, for example, the elastic modulus after curing from 10 GPa to 50 GPa, the thermal expansion coefficient from 3 ppm/° C. to 20 ppm/° C., the glass transition temperature from 80° C. to 320° C., and the thickness from 5 micrometers to 300 micrometers. The spacer chip 50 having these characteristics has such a degree of stiffness that it can be picked up after singulation and be placed on the substrate 10 by die bonding, and can function as a support body for the memory chips 70.

Second Embodiment

Figure 5:
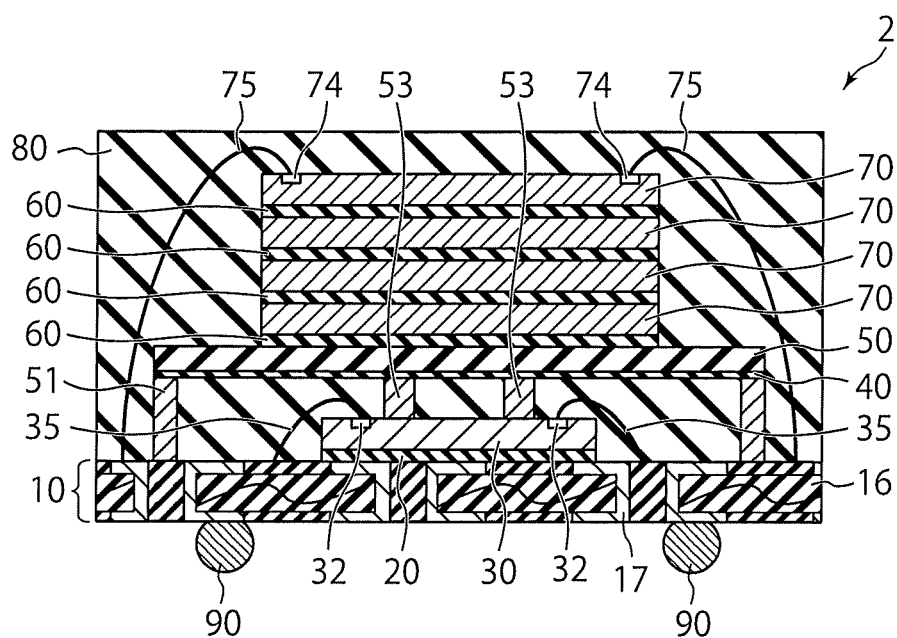
FIG. 5 is a sectional view illustrating an example of the configuration of a semiconductor device according to a second embodiment.

FIG. 5 is a sectional view illustrating an example of the configuration of a semiconductor device 2 according to a second embodiment. The semiconductor device 2 further includes supporting pillars 51 and 53. The supporting pillars 51 being first supporting pillars are provided between the spacer chip 50 and the substrate 10. The supporting pillars 51 function as supporting pillars that support the spacer chip 50 to prevent ends of the spacer chip 50 from descending toward the substrate 10. The supporting pillars 53 being second supporting pillars are provided between the spacer chip 50 and the controller chip 30. The supporting pillars 53 function as supporting pillars that support the spacer chip 50 to prevent the central part of the spacer chip 50 from descending toward the substrate 10. The supporting pillars 51 and 53 are made of the same resin material (first resin material) as that of the spacer chip 50. Accordingly, the adhesiveness between the supporting pillars 51 and 53 and the mold resin 80 is improved and detachment between the supporting pillars 51 and 53 and the mold resin 80 can be suppressed.

In the second embodiment, the adhesive material 40 is provided to cause the spacer chip 50 to adhere to the supporting pillars 51 and 53, and does not cover the controller chip 30 and the metallic wires 35. That is, the supporting pillars 53 and the mold resin 80 are formed between the adhesive material 40 and the controller chip 30 and the controller chip 30 and the metallic wires 35 are covered by the mold resin 80.

Figure 6:
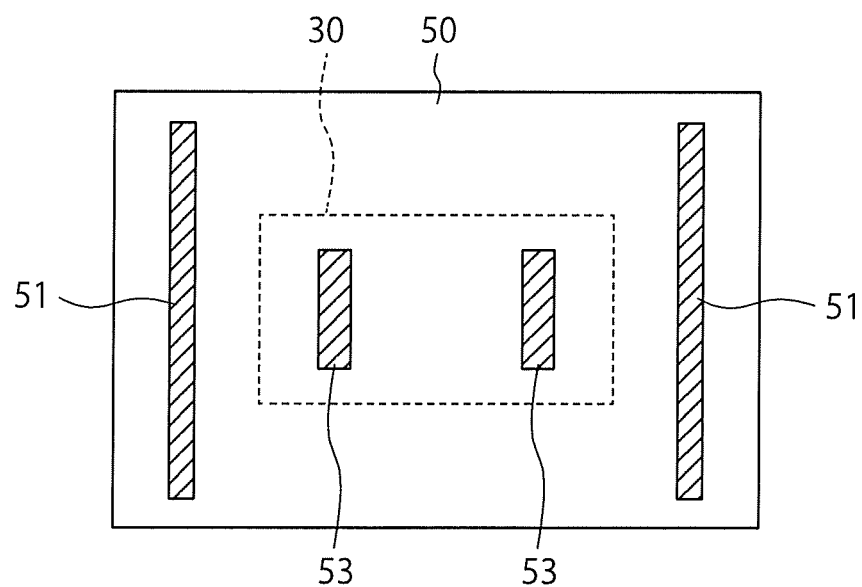
FIG. 6 is a plan view illustrating placement of the control chip, the spacer chip, and the supporting pillars according to the second embodiment.

FIG. 6 is a plan view illustrating placement of the control chip 30, the spacer chip 50, and the supporting pillars 51 and 53 according to the second embodiment. When viewed from above the mount surface of the substrate 10, the supporting pillars 51 have an elongated shape to extend along two opposed sides of the spacer chip 50. The supporting pillars 51 are placed on the outside of the controller chip 30. When viewed from above the mount surface of the substrate 10, the supporting pillars 53 have an elongated shape to extend along two opposed sides of the controller chip 30. The supporting pillars 53 are placed on the inside of the controller chip 30.

The mold resin 80 penetrates from sides of the spacer chip 50 where the supporting pillars 51 and 53 are not provided and seals a space between the spacer chip 50 and the substrate 10 or the controller chip 30. The supporting pillars 51 and 53 extend substantially in parallel to each other. Accordingly, the supporting pillars 51 and 53 interfere little the flow of the mold resin 80 and the mold resin 80 is easily poured into a space under the spacer chip 50.

Other configurations of the semiconductor device 2 according to the second embodiment can be identical to the corresponding configurations of the first embodiment. Therefore, the second embodiment can obtain effects identical to those of the first embodiment.

The spacer chip 50 can be stuck onto the supporting pillars 51 and 53 after the supporting pillars 51 and 53 are stuck onto the substrate 10 or the controller chip 30. Alternatively, the spacer chip 50 can be stuck onto the substrate 10 and the controller chip 30 along with the supporting pillars 51 and 53 after the supporting pillars 51 and 53 are stuck onto the back surface of the spacer chip 50.

Third Embodiment

Figure 7:
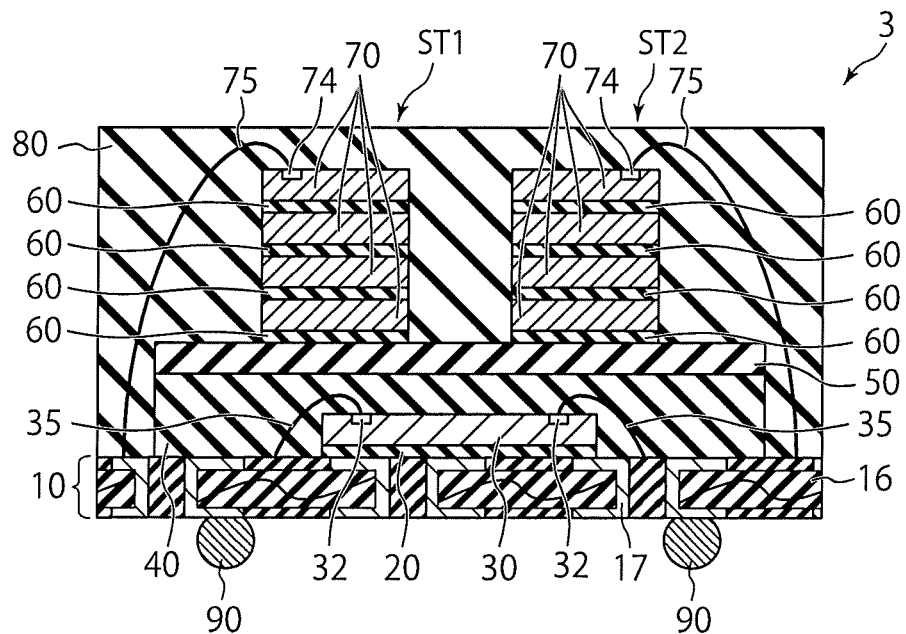
FIG. 7 is a sectional view illustrating an example of the configuration of a semiconductor device according to a third embodiment.

FIG. 7 is a sectional view illustrating an example of the configuration of a semiconductor device 3 according to a third embodiment. The semiconductor device 3 according to the third embodiment includes first and second stack bodies ST1 and ST2 placed adjacent to each other on the spacer chip 50. The first stack body ST1 includes a plurality of the memory chips 70 stacked on the spacer chip 50. The second stack body ST2 includes a plurality of the memory chips 70 stacked adjacent to the first stack body ST1 on the spacer chip 50. That is, the memory chips 70 are stacked like twin towers in the third embodiment.

In a case where the memory chips 70 are further downscaled, the memory chips 70 can be stacked as a plurality of stack bodies placed in parallel on the spacer chip 50 as in the third embodiment. This configuration can increase the storage capacity of the memory chips 70.

Other configurations of the semiconductor device 3 according to the third embodiment can be identical to the corresponding configurations of the first embodiment. Therefore, the third embodiment can obtain effects identical to those of the first embodiment.

In addition, in the third embodiment, the supporting pillars 51 and 53 can be provided while the third embodiment is combined with the second embodiment. With this combination, the third embodiment can obtain effects identical to those of the second embodiment.

Fourth Embodiment

Figure 8:
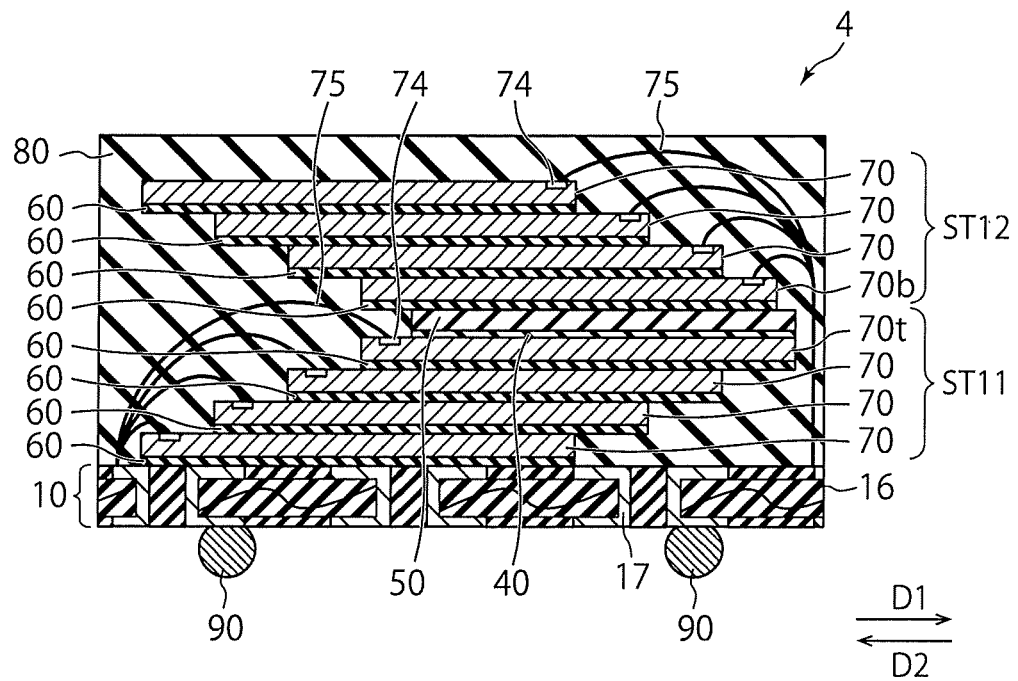
FIG. 8 is a sectional view illustrating an example of the configuration of a semiconductor device according to a fourth embodiment.

FIG. 8 is a sectional view illustrating an example of the configuration of a semiconductor device 4 according to a fourth embodiment. In the fourth embodiment, a plurality of the memory chips 70 are stacked instead of the controller chip 30 under the spacer chip 50. The memory chips 70 are stacked also on the spacer chip 50.

The semiconductor device 4 includes first and second stack bodies ST11 and ST12 each configured by stacking a plurality of the memory chips 70. The first stack body ST11 includes the memory chips 70 stacked to be displaced from each other in a direction D1 substantially parallel to the mount surface of the substrate 10. The second stack body ST12 includes the memory chips 70 stacked to be displaced from each other in a direction D2 opposite to the direction D1. The spacer chip 50 and the adhesive material 40 are provided between the first stack body ST11 and the second stack body ST12. That is, the memory chips 70 of the first stack body ST11 are stacked to be displaced from each other in the direction D1 between the substrate 10 and the spacer chip 50. The memory chips 70 of the second stack body ST12 are stacked on the spacer chip 50 to be displaced from each other in the opposite direction D2 to the direction in which the memory chips 70 of the first stack body ST11 are displaced.

The memory chips 70 are provided instead of the controller chip 30 under the spacer chip 50. In the present embodiment, the adhesive material 40 does not embed the memory chips 70 and causes the spacer chip 50 to adhere to the first stack body ST11.

This provision of the spacer chip 50 between the first stack body ST11 and the second stack body ST12 facilitates wire bonding to a memory chip 70*t* located in the topmost layer of the first stack body ST11.

For example, in a case where the second stack body ST12 is stuck directly on the memory chip 70*t* in the topmost layer of the first stack body ST11, the bonding pad 74 of the memory chip 70*t* in the topmost layer is covered by a memory chip 70*b* in the bottommost layer of the second stack body ST12. Even if the memory chip 70*b* is displaced from the memory chip 70*t* in the direction D1, it is difficult to bond the metallic wire 75 to the memory chip 70*t* in the topmost layer of the first stack body ST11 when the thickness of the memory chip 70*b* is small.

In contrast thereto, the provision of the spacer chip 50 between the first stack body ST11 and the second stack body ST12 separates the memory chip 70*t* in the topmost layer of the first stack body ST11 and the memory chip 70*b* in the bottommost layer of the second stack body ST12 from each other to some extent. Accordingly, the metallic wire 75 can be easily bonded to the bonding pad 74 of the memory chip 70*t* in the topmost layer of the first stack body ST11.

Due to the provision of the spacer chip 50 between the first stack body ST11 and the second stack body ST12, the spacer chip 50 also has a function as a supporting body for the second stack body ST12. Accordingly, a stack structure including the first and second stack bodies ST11 and ST12 can be stabilized.

A thermosetting resin material is used for the spacer chip 50 similarly to that in the first embodiment. This configuration improves the adhesiveness between the spacer chip 50 and the mold resin 80 and suppresses detachment from occurring between the spacer chip 50 and the mold resin 80.

Fifth Embodiment

Figure 9:
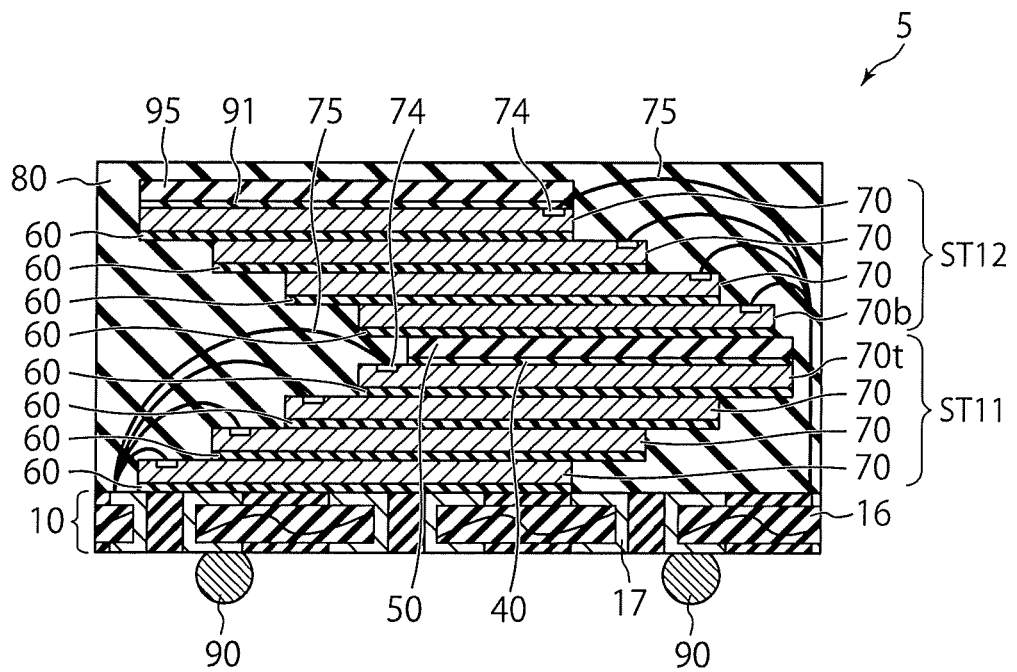
FIG. 9 is a sectional view illustrating an example of the configuration of a semiconductor device according to a fifth embodiment.

FIG. 9 is a sectional view illustrating an example of the configuration of a semiconductor device 5 according to a fifth embodiment. The fifth embodiment is different from the fourth embodiment in that a cushioning material 95 is provided on the second stack body ST12.

The cushioning material 95 is stuck onto the memory chip 70 in the topmost layer of the second stack body ST12 with an adhesive material 91 interposed therebetween. The cushioning material 95 is composed of a thermosetting resin material similarly to the spacer chip 50.

After sealing with the mold resin 80, printing is performed with laser light or the like on the surface of the mold resin 80. At this time, when the film thickness of the mold resin 80 on the second stack body ST12 is small, the memory chips 70 of the second stack body ST12 may be damaged by the laser light and be broken.

In contrast thereto, according to the fifth embodiment, the cushioning material 95 is provided on the second stack body ST12. Therefore, the cushioning material 95 can absorb shock of the laser light and protect the memory chips 70 of the stack body ST12.

Other configurations of the fifth embodiment can be identical to the corresponding configurations of the fourth embodiment. Therefore, the fifth embodiment can obtain effects identical to those of the fourth embodiment.

Sixth Embodiment

Figure 10:
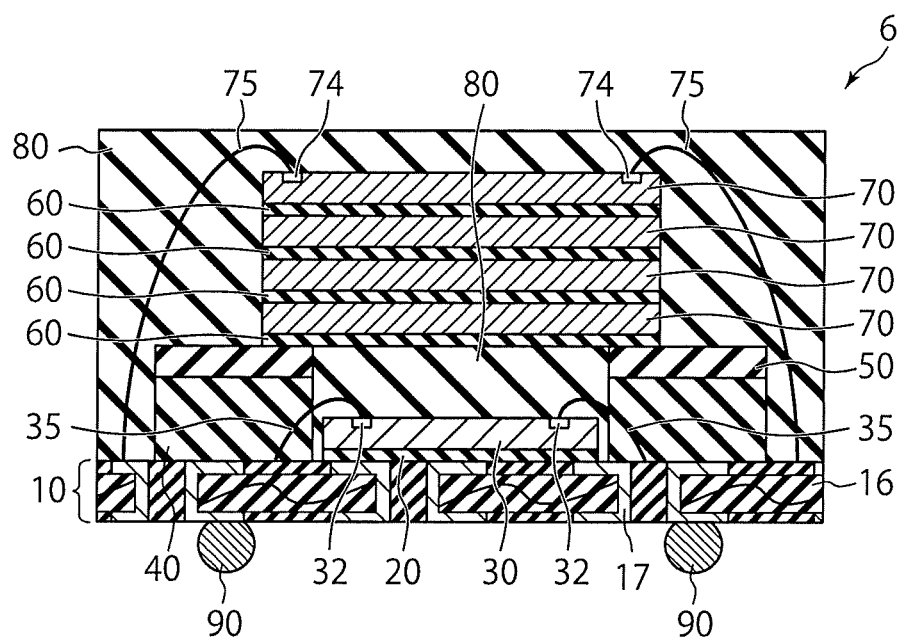
FIG. 10 is a sectional view illustrating an example of the configuration of a semiconductor device according to a sixth embodiment.

FIG. 10 is a sectional view illustrating an example of the configuration of a semiconductor device 6 according to a sixth embodiment. In the sixth embodiment, the spacer chip 50 is divided into two parts, which are placed above the substrate 10 on both sides of the controller chip 30, respectively. Accordingly, the adhesive material 40 is also divided into two parts, which are placed on the both sides of the controller chip 30, respectively. That is, when viewed from above the mount surface of the substrate 10, the adhesive material 40 and the spacer chip 50 are provided on two substrate regions on the outside of the controller chip 30. The adhesive materials 40 are provided between the spacer chips 50 and the substrate 10, cause the spacer chips 50 and the substrate 10 to adhere to each other, and support the spacer chips 50, respectively. While the adhesive materials 40 are not provided on the controller chip 30, the adhesive materials 40 cover parts of the metallic wires 35.

The mold resin 80 is filled in a space between the two spacer chips 50 and the two adhesive materials 40. The mold resin 80 covers the controller chip 30.

The memory chips 70 are provided above the controller chip 30 to bridge between the spacer chips 50 located on the both sides of the controller chip 30. That is, when viewed from above the mount surface of the substrate 10, the memory chips 70 overlap with the control chip 30. Even if the spacer chips 50 are provided as two divided parts, they can support the memory chips 70.

A thermosetting resin identical to that in the first embodiment is used for the spacer chips 50. Therefore, the sixth embodiment can also obtain effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a first semiconductor chip provided above the substrate;
a second semiconductor chip provided above the first semiconductor chip;
a spacer chip provided between the first semiconductor chip and the second semiconductor chip with regard to a direction orthogonal to a mount surface of the substrate, the spacer chip being made of a first resin material;
a first adhesive material provided between the spacer chip and the substrate or the first semiconductor chip;
a second adhesive material provided between the spacer chip and the second semiconductor chip; and
a second resin material covering the first and second semiconductor chips and the spacer chip, wherein
a plurality of the second semiconductor chips are stacked above the spacer chip,
a first stack body and a second stack body are formed,
the first stack body including a first part of the plurality of second semiconductor chips stacked above the spacer chip, and
the second stack body including a second part of the plurality of second semiconductor chips staked adjacent to the first stack body above the spacer chip.

2. The device of claim 1, wherein the first resin material is a same material as the second resin material.

3. The device of claim 1, further comprising a plurality of first supporting pillars provided between the spacer chip and the substrate and made of the first resin material.

4. The device of claim 3, further comprising a second supporting pillar provided between the spacer chip and the first semiconductor chip and made of the first resin material.

5. The device of claim 4, wherein the second supporting pillar and the second resin material are formed between the first adhesive material and the first semiconductor chip.

6. The device of claim 1, wherein an outer edge of the spacer chip is located on an outer side than an outer edge of the first semiconductor chip when viewed from above the mount surface of the substrate.

7. The device of claim 1, wherein
the second adhesive material is provided between the spacer chip and the second semiconductor chip and between the stacked second semiconductor chips.

8. The device of claim 1, wherein
the second semiconductor chip is a memory chip, and
the first semiconductor chip is a controller chip configured to control the memory chip.

9. The device of claim 1, wherein
the substrate is a stack substrate including a third resin material and a conductive material, and
the first resin material is a same material as the third resin material.

10. The device of claim 1, wherein the first resin material is a thermosetting resin having an epoxy resin as a primary component and containing a phenol resin and a silica filler.

11. The device of claim 1, wherein the first resin material is a thermosetting resin having an epoxy resin as a primary component and containing a phenol resin, an acrylic resin, a silica filler, a titanium oxide filler, and a glass cloth.

12. The device of claim 1, wherein the first adhesive material is a thermosetting resin containing an epoxy resin, a phenol resin, an acrylic resin, and a silica filler.

13. A semiconductor device comprising:
a substrate;
a first semiconductor chip provided above the substrate;
a first adhesive material provided on a plurality of substrate regions on outside of the first semiconductor chip when viewed from above a mount surface of the substrate;
a plurality of spacer chips supported by the first adhesive material to be respectively provided above the substrate regions and made of a first resin material;
a second adhesive material provided on the spacer chips;
a second semiconductor chip provided on the second adhesive material and overlapping with the first semiconductor chip when viewed from above the mount surface of the substrate; and
a second resin material covering the first and second semiconductor chips and the spacer chips.

14. The device of claim 13, wherein the first resin material is a same material as the second resin material.

15. A semiconductor device comprising:
a substrate;
a first semiconductor chip provided above the substrate;
a second semiconductor chip provided above the first semiconductor chip;
a spacer chip provided between the first semiconductor chip and the second semiconductor chip with regard to a direction orthogonal to a mount surface of the substrate, the spacer chip being made of a first resin material;
a first adhesive material provided between the spacer chip and the substrate or the first semiconductor chip;
a second adhesive material provided between the spacer chip and the second semiconductor chip;
a second resin material covering the first and second semiconductor chips and the spacer chip;
a plurality of first supporting pillars provided between the spacer chip and the substrate and made of the first resin material; and
a second supporting pillar provided between the spacer chip and the first semiconductor chip and made of the first resin material.

16. The device of claim 15, wherein the first resin material is a same material as the second resin material.

17. The device of claim 15, wherein the second supporting pillar and the second resin material are formed between the first adhesive material and the first semiconductor chip.

18. The device of claim 15, wherein an outer edge of the spacer chip is located on an outer side than an outer edge of the first semiconductor chip when viewed from above the mount surface of the substrate.

19. The device of claim 15, wherein
a plurality of the second semiconductor chips are stacked above the spacer chip, and the second adhesive material is provided between the spacer chip and the second semiconductor chip and between the stacked second semiconductor chips.

20. The device of claim 15, wherein
the second semiconductor chip is a memory chip, and
the first semiconductor chip is a controller chip configured to control the memory chip.

* * * * *